(12) United States Patent
Kim et al.

(10) Patent No.: US 12,516,014 B2
(45) Date of Patent: Jan. 6, 2026

(54) PHOTORESIST COMPOSITION INCLUDING A CHRYSENE COMPOUND, METHOD OF FORMING A PATTERN USING THE SAME, AND METHOD OF FABRICATING 6-NITROCHRYSENE

(71) Applicant: SAMSUNG ELECTRONICS CO., LTD., Suwon-si (KR)

(72) Inventors: Jonghoon Kim, Suwon-si (KR); Suk Koo Hong, Suwon-si (KR); Young Gyu Kim, Gunpo-si (KR); Jooyoung Song, Suwon-si (KR); Hae Min Yang, Seoul (KR); Gumhye Jeon, Suwon-si (KR); Juhee Kim, Seoul (KR); Sunah Lee, Seoul (KR); Ahhyun Lee, Seoul (KR); Hong Won Lee, Seoul (KR)

(73) Assignees: SAMSUNG ELECTRONICS CO., LTD., Suwon-si (KR); SEOUL NATIONAL UNIVERSITY R&DB FOUNDATION, Seoul (KR)

( * ) Notice: Subject to any disclaimer, the term of this patent is extended or adjusted under 35 U.S.C. 154(b) by 482 days.

(21) Appl. No.: 18/119,388

(22) Filed: Mar. 9, 2023

(65) Prior Publication Data

US 2023/0357123 A1 Nov. 9, 2023

(30) Foreign Application Priority Data

May 4, 2022 (KR) ........................ 10-2022-0055672

(51) Int. Cl.
 C07C 205/06 (2006.01)
 G03F 7/004 (2006.01)
 G03F 7/029 (2006.01)
 G03F 7/038 (2006.01)

(52) U.S. Cl.
 CPC .......... *C07C 205/06* (2013.01); *G03F 7/0048* (2013.01); *G03F 7/029* (2013.01); *G03F 7/0382* (2013.01)

(58) Field of Classification Search
 CPC .............. C07C 205/06; C07C 2531/02; C07C 2527/08; C07C 1/34; C07C 201/08; C07C 2603/48; G03F 7/0048; G03F 7/029; G03F 7/0382; G03F 7/0392
 See application file for complete search history.

(56) References Cited

U.S. PATENT DOCUMENTS

| | | | |
|---|---|---|---|
| 4,829,090 A | 5/1989 | Bair | |
| 6,168,897 B1 | 1/2001 | Ushirogouchi et al. | |
| 10,437,148 B2 | 10/2019 | Toida et al. | |
| 2008/0038662 A1* | 2/2008 | Hatakeyama | G03F 7/091 430/323 |

FOREIGN PATENT DOCUMENTS

| | | |
|---|---|---|
| CN | 104860791 A | 8/2015 |
| JP | 3763693 B2 | 4/2006 |
| JP | 4613740 B2 | 1/2011 |
| JP | 4802785 B2 | 10/2011 |
| JP | 5514462 B2 | 6/2014 |
| JP | 2016-204283 A | 12/2016 |
| JP | 6243718 B2 | 12/2017 |

OTHER PUBLICATIONS

Gogolides et al. Journal of Vacuum Science & Technology B: Microelectronics and Nanometer Structures Processing Measurement and Phenomena, vol. 21, 141 (2003).
Okamoto et al., Synthesis, vol. 49, pp. 2949-2957 (2017).

* cited by examiner

*Primary Examiner* — Jafar F Parsa
(74) *Attorney, Agent, or Firm* — Muir Patent Law, PLLC

(57) ABSTRACT

A photoresist composition, a method of forming a pattern, and a method of synthesizing 6-nitrochrysene, the photoresist composition includes a polymer resin; a photo acid generator; a quencher; an organic solvent; and an etching resistance enhancer, wherein the etching resistance enhancer is represented by the following Chemical Formula 1,

[Chemical Formula 1]

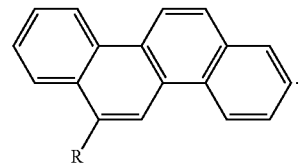

20 Claims, 1 Drawing Sheet

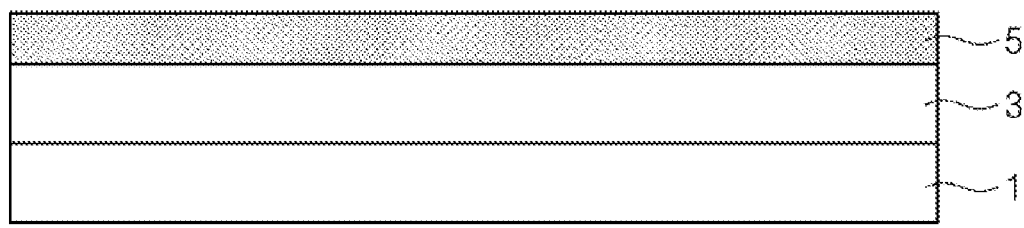
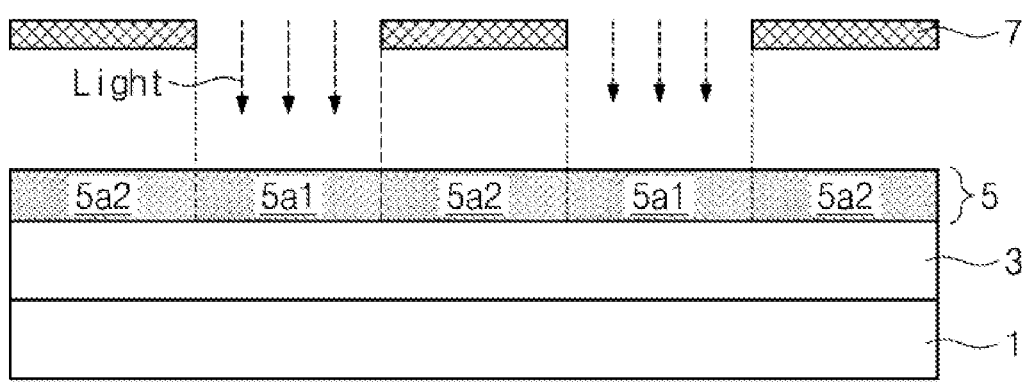
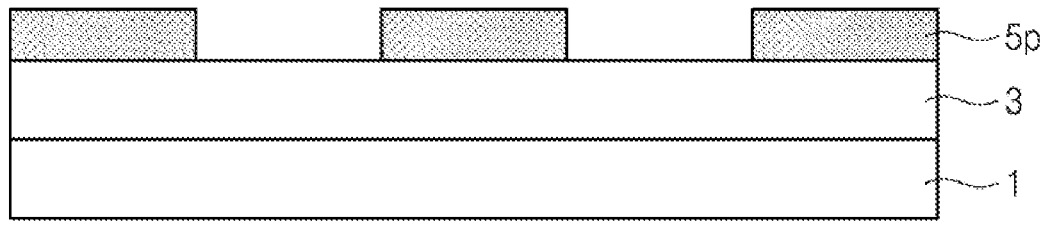
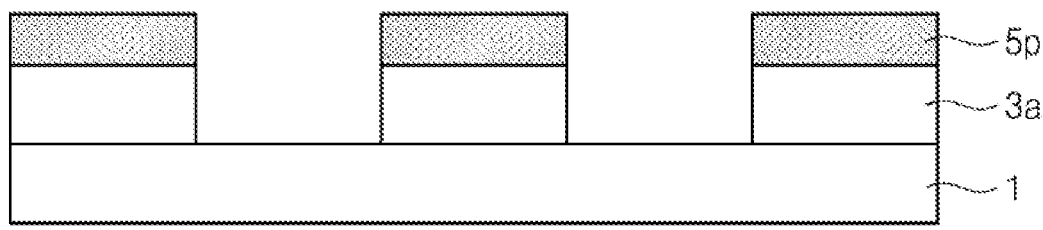

PHOTORESIST COMPOSITION INCLUDING A CHRYSENE COMPOUND, METHOD OF FORMING A PATTERN USING THE SAME, AND METHOD OF FABRICATING 6-NITROCHRYSENE

CROSS-REFERENCE TO RELATED APPLICATIONS

This U.S. non-provisional patent application claims priority under 35 U.S.C. § 119 to Korean Patent Application No. 10-2022-0055672, filed on May 4, 2022, in the Korean Intellectual Property Office, the entire contents of which are hereby incorporated by reference.

BACKGROUND

1. Field

Embodiments relates to a photoresist composition including a chrysene compound, a method of forming a pattern using the same, and a method of synthesizing 6-nitrochrysene.

2. Description of the Related Art

The development of a semiconductor industry uses high integration of semiconductor devices, and processing technology for implementing ultra-fine patterns having a line width of 100 nm or less has emerged. A processing technique for forming the pattern has been mainly achieved by a photo-lithography process using a photoresist. The photo-lithography process includes forming a photoresist pattern by forming a photoresist layer, aligning/exposing a pattern to be formed on the photoresist layer, and developing the photoresist. A photoresist applied to form a pattern is largely divided into a negative type photoresist or a positive type photoresist. Light sources used in the exposure process may include a KrF light source (248 nm), an ArF light source (193 nm), an $F_2$ excimer laser (157 nm), and an extreme ultraviolet (EUV) light source having a wavelength of 13.4 nm.

SUMMARY

The embodiments may be realized by providing a photoresist composition including a polymer resin; a photo acid generator; a quencher; an organic solvent; and an etching resistance enhancer, wherein the etching resistance enhancer is represented by the following Chemical Formula 1,

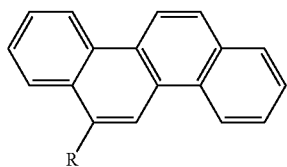

[Chemical Formula 1]

in Chemical Formula 1, R is a nitro group, a nitrile group, a trifluoromethyl group, an acetate group, or a triisopropylsilyl group.

The embodiments may be realized by providing a method of forming a pattern, the method including forming an etching target layer on a substrate; coating the etching target layer with a photoresist composition to form a photoresist layer; performing an exposure process on the photoresist layer; performing a developing process on the photoresist layer to form a photoresist pattern; and etching the etching target layer using the photoresist pattern as an etch mask to form a mask pattern, wherein the photoresist composition includes a polymer resin; a photo acid generator; a quencher; an organic solvent; and an etching resistance enhancer, and the etching resistance enhancer is represented by the following Chemical Formula 1,

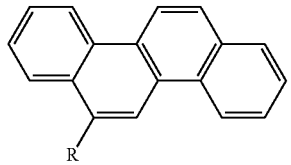

[Chemical Formula 1]

in Chemical Formula 1, R is a nitro group, a nitrile group, a trifluoromethyl group, an acetate group, or a triisopropylsilyl group.

The embodiments may be realized by providing a method of synthesizing 6-nitrochrysene, the method including dissolving 1-(chloromethyl)naphthalene in a first solvent to prepare a first solution, adding triphenylphosphine into the first solution, and stirring the first solution to obtain a first product; filtering the first product and washing the first product with a first detergent; dissolving the first product in a second solvent to prepare a second solution, and adding tetrabutylammoniumhydroxide and benzaldehyde into the second solution and stirring the second solution to obtain a second product; separating and purifying the second product using a column chromatography; dissolving the second product in a third solvent to prepare a third solution, and adding iodine into the third solution and irradiating ultraviolet rays to the third solution while stirring the third solution; removing iodine from the third solution by using an aqueous sodium thiosulfate solution and performing a first extraction process by using water and toluene to obtain a first organic layer; removing toluene from the first organic layer and washing the first organic layer using a second detergent to obtain a third product; dissolving the third product in a fourth solvent to prepare a fourth solution; and adding a nitric acid solution into the fourth solution and reacting the third product with the nitric acid solution.

BRIEF DESCRIPTION OF THE DRAWING

Features will become apparent to those of skill in the art by describing in detail exemplary embodiments with reference to the attached drawing in which:

the FIGURE is a process diagram of stages in a method of forming a pattern according to embodiments.

DETAILED DESCRIPTION

A photoresist composition according to an embodiment may include, e.g., a chrysene compound as an etching resistance enhancer. In an implementation, the photoresist composition may include, e.g., a polymer resin; a photo acid generator; a quencher; an organic solvent; and an etching resistance enhancer. In an implementation, the etching resistance enhancer may be represented by, e.g., Chemical Formula 1 below.

[Chemical Formula 1]

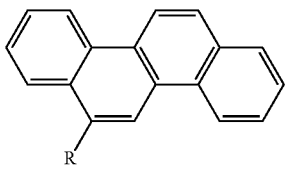

In Chemical Formula 1, R is bonded to the 6th position of chrysene. In an implementation, R may be, e.g., a nitro group, an acetate group, a nitrile group, a trifluoromethyl group, or a triisopropylsilyl group. As used herein, the term "or" is not an exclusive term, e.g., "A or B" would include A, B, or A and B.

In an implementation, R may be a nitro group, e.g., the etching resistance enhancer may be 6-nitrochrysene and may be represented by the following Chemical Formula 2.

[Chemical Formula 2]

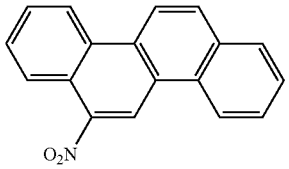

In an implementation, the etching resistance enhancer may be included in an amount of, e.g., 0.1 wt % to 1 wt %, based on a total weight of the photoresist composition. The polymer resin may be included in an amount of, e.g., 3 wt % to 20 wt %, based on the total weight of the photoresist composition. The photo acid generator may be included in an amount of, e.g., 0.5 wt % to 10 wt %, based on the total weight of the photoresist composition. The quencher may be included in an amount of, e.g., 0.1 wt % to 5 wt %, based on the total weight of the photoresist composition. The organic solvent may be included in an amount of, e.g., 64 wt % to 96.3 wt %, based on the total weight of the photoresist composition.

In an implementation, the polymer resin may include, e.g., polymethylmethacrylate (PMMA), poly(t-butylmethacrylate), poly(methacrylic acid), or poly(norbornylmethacrylate). In an implementation, a tert-butoxycarbonyl (t-BOC) group, a tetrahydropyranyl group, a trimethylsilyl group, a phenoxyethyl group, a cyclohexenyl group a, tert-butoxycarbonyl methyl group, a tert-butyl group, an adamantyl group, and a norbornyl group, a methyl cyclopentyl group, an ethyl cyclopentyl group, or an isopropyl cyclopentyl group may be bonded/substituted to a back bone of the single polymer.

The photo acid generator is a substance that is decomposed by light to generate a strong acid. The generated strong acid may act as a catalyst to change a molecular bonding of the polymer resin. In an implementation, the photo acid generator may include, e.g., an aryldiazonium salt, a diaryliodonium salt, a triarylsulfonium salt, a triarylphosphonium salt, a carboxylic acid, a sulfonic acid, a phosphoric acid, or a hydrogen halide.

The quencher may facilitate quenching and may help suppress or control hydrogen ions in a photoresist layer formed from the photoresist composition during an exposure process. In an implementation, the quencher may include, e.g., hydrogen chloride, ethyl ester, an alcohol, water, a fluorine compound, a cyanide compound, a ketone compound, a bromide compound, an iodide compound, an amine compound, an aldehyde compound, a phenol compound, a nitro compound, or a triarylsulfonium salt.

In an implementation, the organic solvent may include, e.g., propylene glycol monomethyl ether (PGME), propylene glycol monomethyl ether acetate, 2-hydroxyisobutyric acid methyl ester (HBM), ethyl lactate, cyclohexanone, heptanone, or lactone.

In an implementation, the photoresist composition may further include, e.g., a cross-linker, a leveling agent, a surfactant, an antioxidant, or an adhesion improver. In an implementation, the photoresist composition may be a positive photoresist.

In an implementation, the photoresist composition may include a chrysene compound, e.g., 6-nitrochrysene, as an etching resistance enhancer. A chrysene molecule or chrysene compound may include four benzene rings, and thus may help improve an etching resistance of the photoresist pattern when an etching process is performed using the photoresist pattern prepared from the photoresist composition. In an implementation, the nitro group included in 6-nitrochrysene may appropriately lower an absorbance of light (e.g., light with a wavelength of 193 nm generated when using an ArF light source) in an exposure process. Accordingly, defects caused by excessive light absorption in the exposure process when the photoresist pattern is formed may be prevented.

The FIGURE is a process diagram of stages in a method of forming a pattern according to embodiments.

Referring to the FIGURE, first, a substrate 1 may be prepared. The substrate 1 may be, e.g., a silicon single crystal wafer or a silicon on insulator (SOI) substrate. An etching target layer 3 may be formed on the substrate 1. The etching target layer 3 may be, e.g., an insulating layer such as a silicon oxide layer, a silicon oxynitride layer, or a silicon nitride layer, or a conductive layer such as a polysilicon layer or a metal-containing layer.

Subsequently, a photoresist composition may be prepared. The photoresist composition may be the same as described above (e.g., according to an embodiment). The etching target layer 3 may be coated with the photoresist composition described above to form a photoresist layer 5 as illustrated in part (a) of the FIGURE.

A soft bake process may be performed on the photoresist layer 5. Accordingly, the organic solvent that may be included in the photoresist layer 5 may be evaporated. As a result, the photoresist layer 5 may be similar to a solid state.

As shown in part (b) of the FIGURE, an exposure process may be performed. In an implementation, the exposure process may be performed using, e.g., an argon fluoride (ArF) light source having a wavelength of 248 nm and a photomask 7. In an implementation, instead of the ArF light source, an $F_2$ excimer laser (157 nm) or an EUV light source (13.4 nm) may be used. In the exposure process, the light passing through the photomask 7 may be irradiated onto the photoresist layer 5. Accordingly, the photoresist layer 5 may have an exposed portion 5a1 and an unexposed portion 5a2. When a positive photoresist is selectively exposed to light, the polymer resin (or polymer compound) in the exposed portion 5a1 may be changed to a low molecular compound by, e.g., acid from the photo acid generator, and may have relatively high solubility compared to the unexposed portion 5a2.

After the exposure process, a post bake process may be performed. In an implementation, at least one of the soft bake process and the post bake process may be omitted.

After the exposure process, a developing process may be performed. The exposed portion Sa1 in the exposure process may be relatively easily removed from the substrate 1 compared to the unexposed portion 5a2 in the developing process. The unexposed portion 5a2 may remain on the substrate 1 even after the development process to become a photoresist pattern 5p as shown in part (c) of the FIGURE. A developer used in the developing process may be, e.g., n-butyl acetate or 2-heptanone.

As shown in part (d) of the FIGURE, the target layer 3 may be etched using the photoresist pattern 5p as an etch mask to form a desired pattern 3a.

The photoresist composition according to an embodiment may include, e.g., a chrysene compound such as 6-nitrochrysene, the photoresist pattern formed using the same has excellent line width roughness (LWR), line edge roughness (LER) and etching resistance, and the etching process is possible even with a small thickness. Therefore, the photoresist layer 5 may be formed thin, and an accurate pattern may be formed in the ArF light source. Accordingly, it is possible to manufacture a highly integrated semiconductor device with excellent performance.

A method for synthesizing 6-nitrochrysene having the structure of Chemical Formula 2 according to embodiments may be as follows.

(a) 1-(chloromethyl)naphthalene may be dissolved in a first solvent to form a first solution, triphenylphosphine may be added into the first solution, and the first solution may be stirred to obtain a first product.

(b) The first product may be filtered and washed with a first detergent.

(c) The first product may be dissolved in a second solvent to form a second solution, tetrabutylammoniumhydroxide and benzaldehyde may be added into the second solution and the second solution may be stirred to obtain a second product.

(d) The second product may be separated and purified using column chromatography.

(e) The second product may be dissolved in a third solvent to form a third solution, iodine may be added into the third solution and the third solution may be stirred and simultaneously irradiated with ultraviolet rays.

(f) Iodine may be removed from the third solution by using an aqueous sodium thiosulfate solution, and a first extraction process may be performed using water and toluene to obtain a first organic layer.

(g) Toluene of the first organic layer may be removed and the first organic layer may be washed with a second detergent to obtain a third product.

(h) The third product may be dissolved in a fourth solvent to form a fourth solution.

(i) A nitric acid solution may be added into the fourth solution, and the third product (in the fourth solution) may be reacted with the nitric acid solution. As a result, 6-nitrochrysene may be formed.

In an implementation, the first product may be

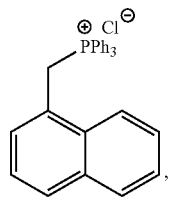

the second product may be

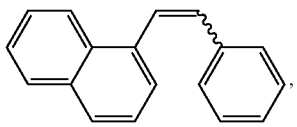 [SMILES: C(=Cc1cccc2ccccc12)c1ccccc1]

and the third product may be chrysene.

In an implementation, the method for synthesizing the chrysene compound may further include the following process.

(j) Sodium bicarbonate aqueous solution may be added to the fourth solution to neutralize the fourth solution (e.g., containing the 6-nitrochrysene reaction product), and a second extraction process may be performed using water and dichloromethane (DCM) to obtain a second organic layer.

(k) 6-nitrochrysene may be separated and purified from the second organic layer using column chromatography.

(l) 6-nitrochrysene may be washed with a third detergent. Thereby, 6-nitrochrysene may be obtained in a powder form.

In an implementation, the first solvent may be, e.g., toluene, and the first detergent may be, e.g., diethyl ether. The second solvent may be, e.g., dichloromethane, and the third solvent may be, e.g., toluene. The second detergent may be, e.g., methanol, and the fourth solvent may be, e.g., dichloromethane. The third detergent may be, e.g., diethyl ether.

In an implementation, stirring in step (a) may be carried out, e.g., at 100 to 120° C. for 10 to 14 hours.

In step (a), 1-(chloromethyl)naphthalene and triphenylphosphine may be added into the first solution in a molar ratio of, e.g., 1:3.

The stirring in step (c) may be carried out, e.g., at 10 to 40° C. for 10 to 14 hours.

The stirring in step (e) may be carried out, e.g., for 20 to 28 hours.

Step (i) may be performed for, e.g., 2 to 4 hours.

After step (l), 6-nitrochrysene having a purity of 95 to 100% may be obtained.

The method for synthesizing 6-nitrochrysene according to an embodiment may be expressed in a reaction scheme as follows.

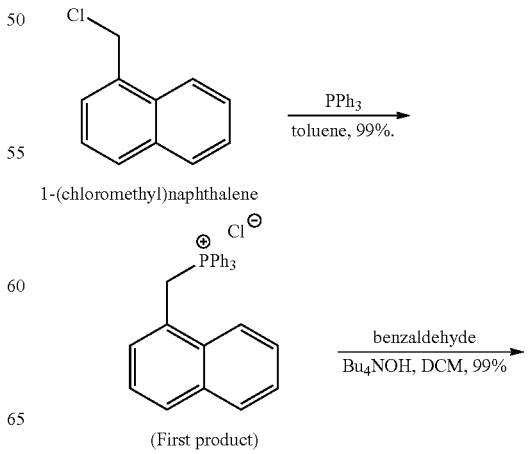

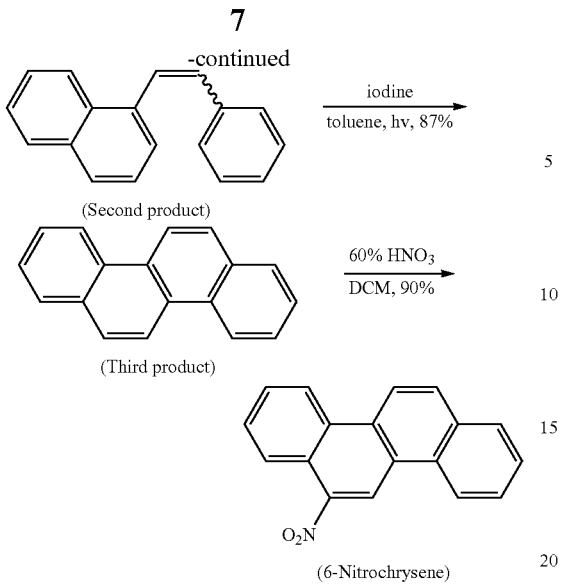

In an implementation, the nitric acid solution may be added and reacted in step (i) to form 6-nitrochrysene. In an implementation, other substances may be added instead of the nitric acid solution. Like this, the chrysene compound of Chemical Formula 1 may be synthesized.

6-nitrochrysene is a very expensive material. In the method for synthesizing 6-nitrochrysene according to an embodiment, 6-nitrochrysene may be synthesized using 1-(chloromethyl)naphthalene and triphenylphosphine as starting materials, which are relatively inexpensive compared to 6-nitrochrysene. This is very economical. In addition, 6-nitrochrysene having a high purity of 95 to 100% may be synthesized by the method for synthesizing 6-nitrochrysene according to an embodiment.

Example 1: Synthesis of 6-Nitrochrysene 1) 1-(chloromethyl)naphthalene (5 g, 28 mmol) was dissolved in 50 ml of toluene to prepare a first solution, and 20 ml (84 mmol) of triphenylphosphine (PPh$_3$) was added into the first solution and the first solution was stirred at 110° C. for 12 hours to prepare a first product. The first product was in the form of a white powder.
2) The first product of the white powder was filtered and washed three times with diethyl ether. Therefore, the first product (12.29 g, 99%) was obtained as a white powder.
3) The first product (5 g, 11.4 mmol) was dissolved in 50 ml of DCM to prepare a second solution, and 17 ml (17.1 mmol) of tetrabutylammoniumhydroxide (Bu$_4$NOH) and benzaldehyde (1.3 ml, 12.54 mmol) were added into the second solution and then the second solution was stirred at ambient temperature for 12 hours to form the second product.
4) The second product was separated and purified using SiO$_2$ column chromatography. The second product (2.6255 g, 99%) obtained by separation and purification was in the form of a clear liquid.
5) The second product (0.5 g, 2.17 mmol) was dissolved in 50 ml of toluene to prepare a third solution, and iodine (0.1378 g, 0.55 mmol) was added into the third solution, and the third solution was irradiated with ultraviolet rays in a dark room at ambient temperature while stirring the third solution for 24 hours.
6) After removing iodine from the third solution by using an aqueous sodium thiosulfate solution, a first organic layer was obtained by extraction with water and toluene.
7) After removing toluene from the extracted first organic layer by evaporation under reduced pressure, the first organic layer was washed three times with methanol to obtain a third product in a form of a white powder (0.4327 g, 87%).
8) The third product (0.5 g, 2.2 mmol) was dissolved in 20 ml of DCM to prepare a fourth solution.
9) A 60% nitric acid solution (1.37 ml, 33 mmol) was slowly added into the fourth solution and the fourth solution was stirred for 3 hours to form 6-nitrochrysene in the fourth solution.
10) The fourth solution (containing the 6-nitrochrysene) was neutralized by adding sodium bicarbonate aqueous solution to the fourth solution, and extracted with water and DCM to obtain a second organic layer.
11) 6-nitrochrysene was separated and purified from the second organic layer using SiO$_2$ column chromatography. The purified 6-nitrochrysene was washed five times with diethyl ether. As a result, 6-nitrochrysene (0.5530 g, purity 99.98%) was obtained in the form of a pale yellow powder.

Example 2: Preparation of Photoresist Composition Including 6-Nitrochrysene 6-nitrochrysene prepared in Example 1 was added to a photoresist composition. In Example 2, four types of photoresist compositions were prepared. Components and contents included in the photoresist compositions are shown in Table 1.

TABLE 1

| | Polymer Resin PMMA | Photo Acid Generator triarylsulfonium | Quencher amine | Etching Resistance Enhancer 6-nitrocrysene | Organic Solvent PGME/HBM |
|---|---|---|---|---|---|
| Composition 1 (Control Group) | 10 wt. % | 5 wt. % | 2 wt. % | 0.00 wt. % | 83 wt. % |
| Composition 2 | 10 wt. % | 5 wt. % | 2 wt. % | 0.10 wt. % | 82.9 wt. % |
| Composition 3 | 10 wt. % | 5 wt. % | 2 wt. % | 0.50 wt. % | 82.5 wt. % |
| Composition 4 | 10 wt. % | 5 wt. % | 2 wt. % | 1.00 wt. % | 82 wt. % |

Example 3: Evaluation of Photoresist Pattern

1) LWR and LER
Line width roughness (LWR) and Line edge roughness (LER) of photoresist patterns formed after performing an exposure process and a development process described with reference to the FIGURE with the photoresist compositions of Table 1 above were evaluated and results are shown in Table 2 and Table 3, respectively. In Tables 2 and 3, a focus indicates a focal length of a light source during the exposure process.

TABLE 2

Line Width Roughness (LWR)

| Focus (μm) | Composition 1 (0%) | Composition 2 (0.1%) | Composition 3 (0.5%) | Composition 4 (1.0%) |
|---|---|---|---|---|
| 0.05 | 5.69 | 5.29 | 4.27 | 4.95 |
| 0.1 | 5.77 | 4.42 | 4.93 | 4.93 |
| 0.15 | 8.7 | 4.81 | 4.56 | 5.13 |
| 0.2 | 8.59 | 4.34 | 5.24 | 5.48 |

TABLE 3

LINE EDGE ROUGHNESS (LER)

| Focus (μm) | Composition 1 (0%) | Composition 2 (0.1%) | Composition 3 (0.5%) | Composition 4 (1.0%) |
|---|---|---|---|---|
| 0.05 | 2.54 | 2.36 | 3.21 | 3.38 |
| 0.1 | 2.92 | 2.72 | 2.74 | 3 |
| 0.15 | 4.35 | 3.59 | 3.85 | 3.13 |
| 0.2 | 6.89 | 2.45 | 3.76 | 3.93 |

Referring to Tables 2 and 3, it may be seen that the Photoresist Compositions 2 to 4, to which 6-nitrochrysene was added, had overall lower LWR and LER, in comparison with the Photoresist Composition 1 which is the control group, to which 6-nitrochrysene was not added.

2) Etching Resistance

Bare wafers were coated with the photoresist compositions of Table 1, respectively and bake processes were performed to form photoresist layers. Then, an etching process was performed on the photoresist layers. In the etching process, $C_4F_6$, $CH_3F$, $CF_4$ and $O_2$ plasma were used as etchants. Table 4 shows a thickness change of the photoresist layers before and after the etching process.

TABLE 4

| | Thickness Before Etching (Å) | Thickness After Etching (Å) | Thickness Difference (Å) | Resistance Increase Amount (Å) |
|---|---|---|---|---|
| Composition 1 (0%) | 3297.3 | 552.2 | 2745.2 | |
| Composition 2 (0.1%) | 3447.2 | 712.7 | 2734.4 | 10.8 (0.4%) |
| Composition 3 (0.5%) | 3456.3 | 734.9 | 2721.4 | 23.8 (0.9%) |
| Composition 4 (1.0%) | 3480.7 | 756.1 | 2724.5 | 20.7 (0.8%) |

In Table 4, a resistance increase amount indicates a degree of decrease in a thickness difference compared to the photoresist layer formed using Photoresist Composition 1. That is, the resistance increase amount of the Photoresist Composition 2 was obtained by subtracting a thickness difference value of Photoresist Composition 1 from a thickness difference value of Photoresist Composition 2. The resistance increase amount of Photoresist Composition 3 was obtained by subtracting the thickness difference value of Photoresist Composition 1 from a thickness difference value of Photoresist Composition 3. The resistance increase amount of Photoresist Composition 4 was obtained by subtracting the thickness difference value of Photoresist Composition 1 from a thickness difference value of Photoresist Composition 4. Referring to Table 4, it may be seen that Photoresist Compositions 2 to 4 (to which 6-nitrochrysene was added) had a small overall thickness difference compared to Photoresist Composition 1, the control group, in which 6-nitrochrysene was omitted. In particular, it may be seen that Photoresist Composition 3, in which 0.5 wt. % of 6-nitrochrysene was added, had the smallest thickness difference, and thus has the best etching resistance.

The photoresist composition according to an embodiment may include the chrysene compound, e.g., 6-nitrochrysene, as the etching resistance enhancer. The chrysene molecule or chrysene compound may include the four benzene rings, and thus may help improve the etching resistance of the photoresist pattern when the etching process is performed using the photoresist pattern prepared from the photoresist composition. In an implementation, the nitro group included in 6-nitrochrysene may appropriately lower the absorbance of light (e.g., light with a wavelength of 193 nm generated when using an ArF light source) in the exposure process. Accordingly, defects caused by excessive light absorption in the exposure process when the photoresist pattern is formed may be prevented.

The method of forming the pattern according to the embodiments may use the photoresist composition, and accurate and fine patterns may be formed.

The method of synthesizing 6-nitrochrysene according to embodiments may use 1-(chloromethyl)naphthalene and triphenylphosphine as starting materials, which are relatively inexpensive compared to 6-nitrochrysene, and may synthesize 6-nitrochrysene with high purity. This is very economical.

One or more embodiments may provide an (e.g., ArF) photoresist composition capable of implementing an accurate pattern.

One or more embodiments may provide a method of forming a pattern capable of implementing an accurate and fine pattern.

One or more embodiments may provide an economical method of synthesizing 6-nitrochrysene.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A photoresist composition, comprising:

a polymer resin;

a photo acid generator;

a quencher;

an organic solvent; and an etching resistance enhancer, wherein:

the etching resistance enhancer is represented by the following Chemical Formula 1,

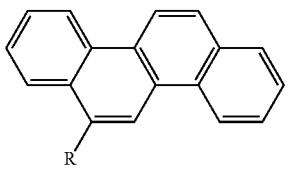

[Chemical Formula 1]

in Chemical Formula 1, R is a nitro group, a nitrile group, a trifluoromethyl group, an acetate group, or a triisopropylsilyl group.

2. The photoresist composition as claimed in claim 1, wherein:
R is a nitro group, and
the etching resistance enhancer is represented by the following Chemical Formula 2,

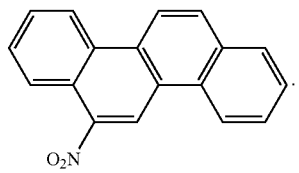

[Chemical Formula 2]

3. The photoresist composition as claimed in claim 1, wherein the photoresist composition includes the etching resistance enhancer in an amount of 0.1 wt % to 1 wt %, based on a total weight of the photoresist composition.

4. The photoresist composition as claimed in claim 3, wherein the photoresist composition includes:
3 wt % to 20 wt % of the polymer resin,
0.5 wt % to 10 wt % of the photo acid generator,
0.1 wt % to 5 wt % of the quencher, and
64 wt % to 96.3 wt % of the organic solvent, all wt % being based on the total weight of the photoresist composition.

5. The photoresist composition as claimed in claim 1, wherein the polymer resin includes polymethylmethacrylate, poly(t-butylmethacrylate), poly(methacrylic acid), or poly(norbornylmethacrylate).

6. The photoresist composition as claimed in claim 1, wherein the photo acid generator includes an aryldiazonium salt, a diaryliodonium salt, a triarylsulfonium salt, a triarylphosphonium salt, a carboxylic acid, a sulfonic acid, a phosphoric acid, or a hydrogen halide.

7. The photoresist composition as claimed in claim 1, wherein the quencher includes hydrogen chloride, an ethyl ester, an alcohol, water, a fluorine compound, a cyanide compound, a ketone compound, a bromide compound, an iodide compound, an amine compound, an aldehyde compound, a phenol compound, a nitro compound, or a triarylsulfonium salt.

8. The photoresist composition as claimed in claim 1, wherein the organic solvent includes propylene glycol monomethyl ether, propylene glycol monomethyl ether acetate, 2-hydroxyisobutyric acid methyl ester, ethyl lactate, ethyl lactate, cyclohexanone, heptanone, or lactone.

9. A method of forming a pattern, the method comprising:
forming an etching target layer on a substrate;
coating the etching target layer with a photoresist composition to form a photoresist layer;
performing an exposure process on the photoresist layer;
performing a developing process on the photoresist layer to form a photoresist pattern; and
etching the etching target layer using the photoresist pattern as an etch mask to form a mask pattern, wherein:
the photoresist composition includes:
a polymer resin;
a photo acid generator;
a quencher;
an organic solvent; and
an etching resistance enhancer, and
the etching resistance enhancer is represented by the following Chemical Formula 1,

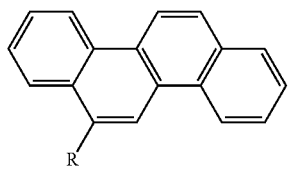

[Chemical Formula 1]

in Chemical Formula 1, R is a nitro group, a nitrile group, a trifluoromethyl group, an acetate group, or a triisopropylsilyl group.

10. The method as claimed in claim 9, wherein the etching resistance enhancer represented by Chemical Formula 1 is represented by the following Chemical Formula 2,

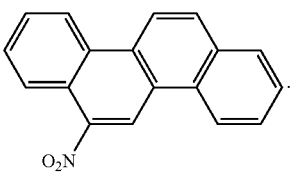

[Chemical Formula 2]

11. A method of synthesizing 6-nitrochrysene, the method comprising:
dissolving 1-(chloromethyl)naphthalene in a first solvent to prepare a first solution, adding triphenylphosphine into the first solution, and stirring the first solution to obtain a first product;
filtering the first product and washing the first product with a first detergent;
dissolving the first product in a second solvent to prepare a second solution, and adding tetrabutylammoniumhydroxide and benzaldehyde into the second solution and stirring the second solution to obtain a second product;
separating and purifying the second product using a column chromatography;
dissolving the second product in a third solvent to prepare a third solution, and adding iodine into the third solution and irradiating ultraviolet rays to the third solution while stirring the third solution;
removing iodine from the third solution by using an aqueous sodium thiosulfate solution and performing a first extraction process by using water and toluene to obtain a first organic layer;
removing toluene from the first organic layer and washing the first organic layer using a second detergent to obtain a third product;

dissolving the third product in a fourth solvent to prepare a fourth solution; and adding a nitric acid solution into the fourth solution and reacting the third product with the nitric acid solution.

12. The method as claimed in claim 11, wherein:
the first solvent is toluene, and
the first detergent is diethyl ether.

13. The method as claimed in claim 11, wherein:
the second solvent is dichloromethane, and
the third solvent is toluene.

14. The method as claimed in claim 11, further comprising:

adding sodium bicarbonate aqueous solution into the fourth solution to neutralize the fourth solution, and performing a second extraction process using water and dichloromethane to obtain a second organic layer; and separating and purifying the second organic layer using a column chromatography and washing the second organic layer.

15. The method as claimed in claim 14, wherein the fourth solvent is dichloromethane.

16. The method as claimed in claim 11, wherein stirring the first solution to obtain a first product is carried out at 100° C. to 120° C. for 10 hours to 14 hours.

17. The method as claimed in claim 11, wherein the 1-(chloromethyl)naphthalene and the triphenylphosphine are added into the first solution in a molar ratio of 1:3.

18. The method as claimed in claim 11, wherein the stirring the second solution to obtain a second product is carried out at 10 to 40° C. for 10 to 14 hours.

19. The method as claimed in claim 11, wherein the stirring the third solution is carried out for 20 to 28 hours.

20. The method as claimed in claim 11, wherein:
the first product is

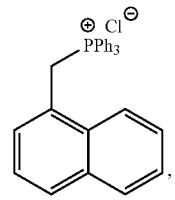

the second product is

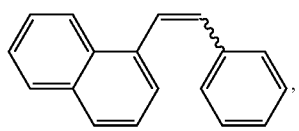 [SMILES: C(=Cc1cccc2ccccc12)c1ccccc1]

and the third product is chrysene.

* * * * *